United States Patent
Gijsbertsen et al.

(10) Patent No.: US 9,519,224 B2
(45) Date of Patent: Dec. 13, 2016

(54) LITHOGRAPHIC APPARATUS AND METHOD

(71) Applicant: ASML Netherlands B.V., Veldhoven (NL)

(72) Inventors: Arjan Gijsbertsen, Vucht (NL); Hubertus Antonius Geraets, Arendonk (BE); Bart Peter Bert Segers, Tessenderlo (BE); Natalia Viktorovna Davydova, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 162 days.

(21) Appl. No.: 14/351,012

(22) PCT Filed: Sep. 21, 2012

(86) PCT No.: PCT/EP2012/068696
§ 371 (c)(1),
(2) Date: Apr. 10, 2014

(87) PCT Pub. No.: WO2013/056941
PCT Pub. Date: Apr. 25, 2013

(65) Prior Publication Data
US 2014/0313496 A1    Oct. 23, 2014

Related U.S. Application Data

(60) Provisional application No. 61/549,548, filed on Oct. 20, 2011.

(51) Int. Cl.
*G03F 7/20* (2006.01)
*G03F 9/00* (2006.01)
*G01T 1/02* (2006.01)

(52) U.S. Cl.
CPC .............. *G03F 7/702* (2013.01); *G01T 1/02* (2013.01); *G03F 7/70558* (2013.01);
(Continued)

(58) Field of Classification Search
CPC ........ G01T 1/02; G03F 7/702; G03F 7/70558; G03F 7/70625; G03F 7/70641; G03F 9/7026; G03F 9/7084; G03F 9/7073; G03F 9/7076; G03F 9/708
See application file for complete search history.

(56) References Cited

U.S. PATENT DOCUMENTS 4,861,982 A * 8/1989 Smid .................... G02B 21/002
                                                              250/235
5,674,650 A    10/1997 Dirksen et al.
(Continued)

FOREIGN PATENT DOCUMENTS

EP    1 256 843 A1    11/2002
EP    1 260 870 A1    11/2002
(Continued)

OTHER PUBLICATIONS

Internation Search Report directed to related International Patent Application No. PCT/EP2012/068696, mailed Nov. 29, 2012; 4 pages.
(Continued)

*Primary Examiner* — Steven H Whitesell Gordon
(74) *Attorney, Agent, or Firm* — Sterne, Kessler, Goldstein & Fox P.L.L.C.

(57) ABSTRACT

A lithographic apparatus comprising a support structure constructed to support a patterning device, the patterning device being capable of imparting an EUV radiation beam with a grating in its cross-section to form a patterned EUV radiation beam, and a projection system configured to project the patterned EUV radiation beam onto a target portion of the substrate, wherein the support structure is provided with a grating comprising a series of first reflective portions which alternates with a series of second reflective portions, the second reflective portions having a reflectivity which is less than the reflectivity of at least part of the first reflective portions and which is greater than zero.

19 Claims, 6 Drawing Sheets

(52) U.S. Cl.
CPC ...... *G03F 7/70625* (2013.01); *G03F 7/70641* (2013.01); *G03F 9/7026* (2013.01); *G03F 9/7084* (2013.01)

(56) References Cited

U.S. PATENT DOCUMENTS

| | | | | |
|---|---|---|---|---|
| 5,910,847 | A * | 6/1999 | Van der Werf | G03F 7/70675 250/492.22 |
| 6,359,678 | B1 * | 3/2002 | Ota | G03F 7/70233 250/216 |
| 6,777,139 | B2 * | 8/2004 | Baselmans | G03F 7/70558 250/491.1 |
| 2002/0175300 | A1 * | 11/2002 | Suzuki | G03F 7/70233 250/548 |
| 2002/0182518 | A1 * | 12/2002 | Van Haren | G03F 7/70633 430/5 |
| 2006/0024850 | A1 | 2/2006 | Monahan et al. | |
| 2009/0190118 | A1 * | 7/2009 | Fukuhara | G03B 27/32 355/77 |

FOREIGN PATENT DOCUMENTS

| | | | |
|---|---|---|---|
| JP | H07-114173 | A | 5/1995 |
| JP | H09-504142 | T | 4/1997 |
| JP | 2006-049596 | A | 2/2006 |
| JP | 2007-201306 | A | 8/2007 |

OTHER PUBLICATIONS

International Preliminary Report on Patentability and Written Opinion of the International Searching Authority directed to related International Patent Application No. PCT/EP2012/068696, issued Apr. 22, 2014; 6 pages.

English-Language Abstract for Japanese Patent Publication No. JPH07114173A, published May 2, 1995; 1 page.

English-Language Abstract for Japanese Patent Publication No. JPH09504142T, published Apr. 22, 1997; 1 page.

English-Language Abstract for Japanese Patent Publication No. JP2006049596A, published Feb. 16, 2006; 1 page.

English-Language Abstract for Japanese Patent Publication No. JP2007201306A, published Aug. 9, 2007; 1 page.

Notice of Reasons for Refusal (with English language translation) directed to related Japanese Patent Application No. 2014-536164, mailed Jul. 29, 2016; 7 pages.

\* cited by examiner

LITHOGRAPHIC APPARATUS AND METHOD

CROSS REFERENCE TO RELATED APPLICATIONS

This application claims the benefit of U.S. provisional application 61/549,548, filed on Oct. 20, 2011 which are incorporated herein in its entirety by reference.

FIELD

The present invention relates to a lithographic apparatus and method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma sources, discharge plasma sources, or sources based on synchrotron radiation provided by an electron storage ring.

EUV radiation may be produced using a plasma. A radiation system for producing EUV radiation may include a laser for exciting a fuel to provide the plasma, and a source for containing the plasma. The plasma may be created, for example, by directing a laser beam at a fuel, such as particles of a suitable material (e.g., tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source may include an enclosing structure or chamber arranged to provide a vacuum environment to support the plasma. Such a radiation system is typically termed a laser produced plasma (LPP) source.

SUMMARY

It may be desirable to be able to measure the position of a focal plane of a projection system of a lithographic apparatus on an image side of the projection system. It may be desirable to be able to measure the dose of radiation which will be delivered to a target portion of a substrate by a lithographic apparatus.

According to a first aspect of the present invention, there is provided a lithographic apparatus comprising a support structure constructed to support a patterning device, the patterning device being capable of imparting an EUV radiation beam with a grating in its cross-section to form a patterned EUV radiation beam, and a projection system configured to project the patterned EUV radiation beam onto a target portion of the substrate, wherein the support structure is provided with a grating comprising a series of first reflective portions which alternates with a series of second reflective portions, the second reflective portions having a reflectivity which is less than the reflectivity of at least part of the first reflective portions and which is greater than zero.

The first reflective portions may be unpatterned areas and the second reflective portions may be unpatterned areas.

The first reflective portions may be rectangular. The second reflective portions may be rectangular.

The first reflective portions may each comprise a subgrating having reflective lines and absorbing lines, and the second reflective portions may comprise unpatterned areas.

The grating may further comprise a series of absorbing portions located between the first and second reflective portions.

The grating may be configured such that the mean intensity of radiation reflected by the first reflective portion and received by the substrate is substantially equal to the mean intensity of radiation reflected by the second reflective portion and received by the substrate.

The second reflective portion may comprise a layer of absorbing material located over a mirror, the layer of absorbing material allowing the transmission of some EUV radiation such that some EUV radiation is reflected from the minor and passes back through the layer of absorbing material.

The reflectivity of the second reflective portion may be around half of the reflectivity of the at least part of the first reflective portion.

The support structure may be provided with a second grating which has an opposite orientation to the grating.

The support structure may be provided with an additional grating which extends transverse to the grating.

The reflectivity of the second reflective portion may be sufficiently high that in use a significant amount of EUV radiation will be reflected from the second reflective portion.

The reflectivity of the second reflective portion may be sufficiently high that in use EUV radiation reflected from the second reflective portion will have a measurable effect on an image of the grating formed in resist on the substrate.

According to a second aspect of the present invention there is provided a patterning device provided with a grating comprising a series of first reflective portions which alternates with a series of second reflective portions, the second reflective portions having a reflectivity which is less than the reflectivity of at least part of the first reflective portions and which is greater than zero.

The second aspect of the present invention may include features of the first aspect of the present invention.

According to a third aspect of the present invention there is provided a method of measuring a dose of radiation projected by a lithographic apparatus onto a substrate, the method comprising illuminating a grating according to the first aspect of the present invention using EUV radiation and using the lithographic apparatus to image that grating into resist on a substrate, then measuring the centre of gravity of the imaged grating using an alignment apparatus of the lithographic apparatus.

According to a fourth aspect of the present invention there is provided a method of measuring a focal plane of a lithographic apparatus, the method comprising illuminating a grating according to the first aspect of the present invention using EUV radiation and using the lithographic apparatus to image that grating into resist on a substrate, then measuring the centre of gravity of the imaged grating using an alignment apparatus of the lithographic apparatus.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the present invention and to enable a person skilled in the relevant art(s) to make and use the present invention.

FIG. 1 schematically depicts a lithographic apparatus according to an embodiment of the present invention.

Figure 1:
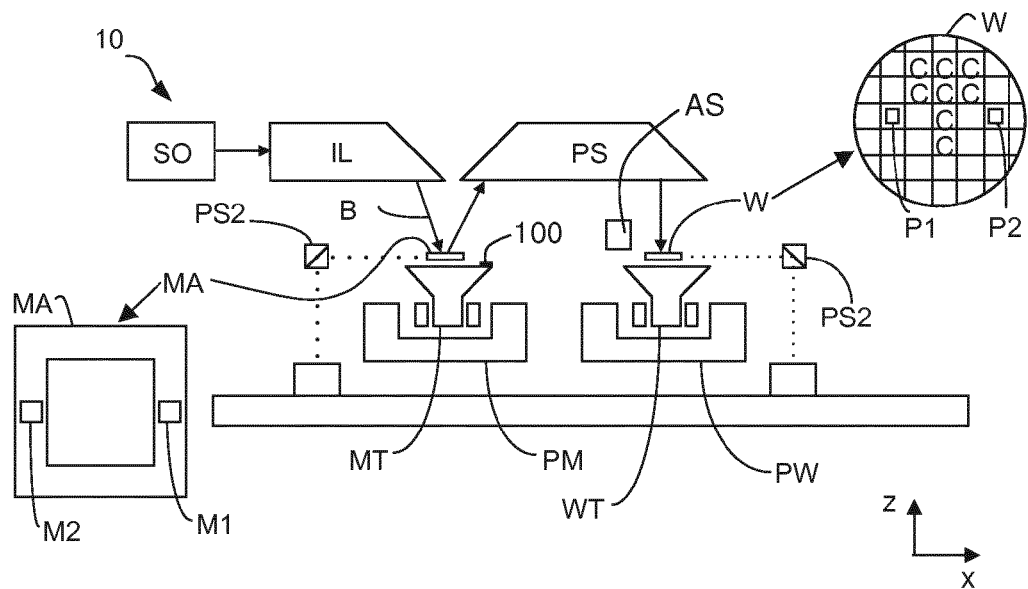

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this present invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented an illumination system (illuminator) IL configured to condition a radiation beam B (e.g., EUV radiation); a support structure (e.g., a mask table) MT constructed to support a patterning device (e.g., a mask or a reticle) MA and connected to a first positioner PM configured to accurately position the patterning device; a substrate table (e.g., a wafer table) WT constructed to hold a substrate (e.g., a resist-coated wafer) W and connected to a second positioner PW configured to accurately position the substrate; and a projection system (e.g., a reflective projection system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable minor array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g., employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives an extreme ultra violet (EUV) radiation beam from the source SO. Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a fuel, such as a droplet, stream or cluster of material having the required line-emitting element, with a laser beam. The source SO may be part of an EUV radiation system including a laser, not shown in FIG. 1, for providing the laser beam exciting the fuel. The resulting plasma emits output radiation, e.g., EUV radiation, which is collected using a radiation collector, disposed in the source. The laser and the source may be separate entities, for example when a $CO_2$ laser is used to provide the laser beam for fuel excitation.

In such cases, the laser is not considered to form part of the lithographic apparatus and the radiation beam is passed from the laser to the source with the aid of a beam delivery system comprising, for example, suitable directing mirrors and/or a beam expander. In other cases the source may be an integral part of the source, for example when the source is a discharge produced plasma EUV generator, often termed as a DPP source.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as facetted field and pupil mirror devices. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g., mask) MA, the radiation beam B passes through the projection system PS, which focuses the beam onto a target portion C of the substrate W. With the aid of the second positioner PW and position sensor PS2 (e.g., an interferometric device, linear encoder or capacitive sensor), the substrate table WT can be moved accurately, e.g., so as to position different target portions C in the path of the radiation beam B. Similarly, the first positioner PM and another position sensor PS1 can be used to accurately position the patterning device (e.g., mask) MA with respect to the path of the radiation beam B. Patterning device (e.g., mask) MA and substrate W may be aligned using mask alignment gratings M1, M2 and substrate alignment gratings P1, P2.

The lithographic apparatus includes an alignment apparatus AS which is configured to measure the positions of alignment gratings (diffraction gratings), thereby allowing the substrate W to be aligned with a pattern to be projected from the patterning device MA. The alignment apparatus AS may comprise a plurality of detectors which are configured to detect radiation which is diffracted from alignment gratings. Although the alignment apparatus AS is schematically represented as being adjacent to the projection system PS of the lithographic apparatus, the alignment apparatus may have any suitable location. The alignment apparatus AS may for example be located away from the projection system PS (e.g., in a so called dual-stage system in which alignment of the entire substrate is measured before exposure of the substrate begins).

The depicted apparatus could be used in at least one of the following modes:

1. In step mode, the support structure (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed.

2. In scan mode, the support structure (e.g., mask table) MT and the substrate table WT are scanned synchronously while a pattern imparted to the radiation beam is projected onto a target portion C (i.e., a single dynamic exposure). The velocity and direction of the substrate table WT relative to the support structure (e.g., mask table) MT may be determined by the (de-)magnification and image reversal characteristics of the projection system PS.

3. In another mode, the support structure (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
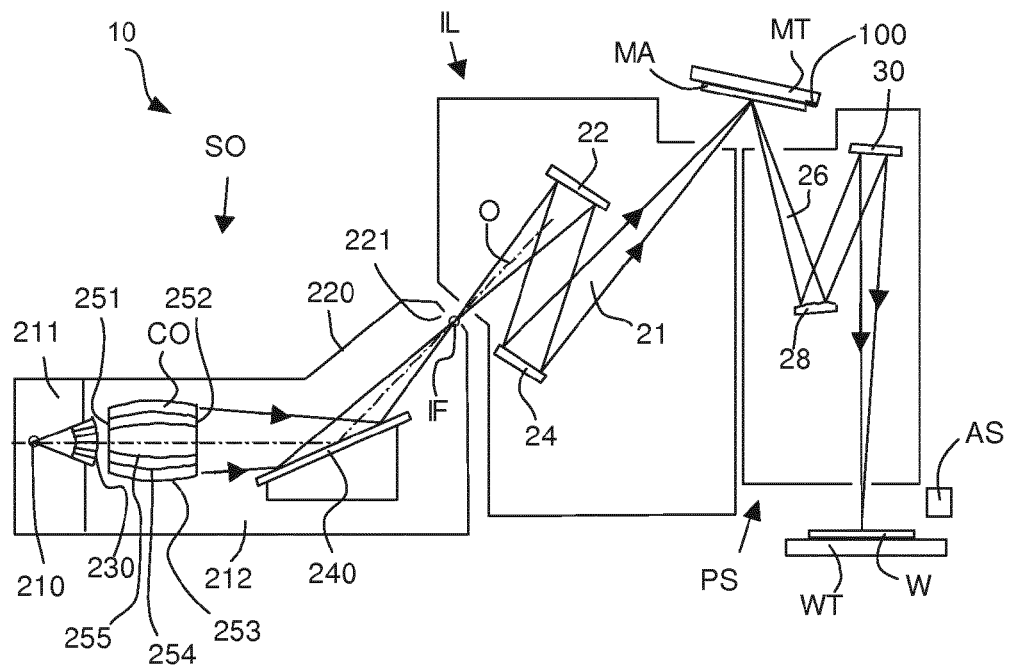
FIG. 2 is a more detailed schematic view of the lithographic apparatus, including a DPP source.

FIG. 2 shows the apparatus 10 in more detail, including the source SO, the illumination system IL, and the projection system PS. The source SO is constructed and arranged such that a vacuum environment can be maintained in an enclosing structure 220 of the source SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 211 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source is arranged such that the intermediate focus IF is located at or near an opening 221 in the enclosing structure 220. The virtual source point IF is an image of the radiation emitting plasma 210.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the Figures, for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Figure 3:
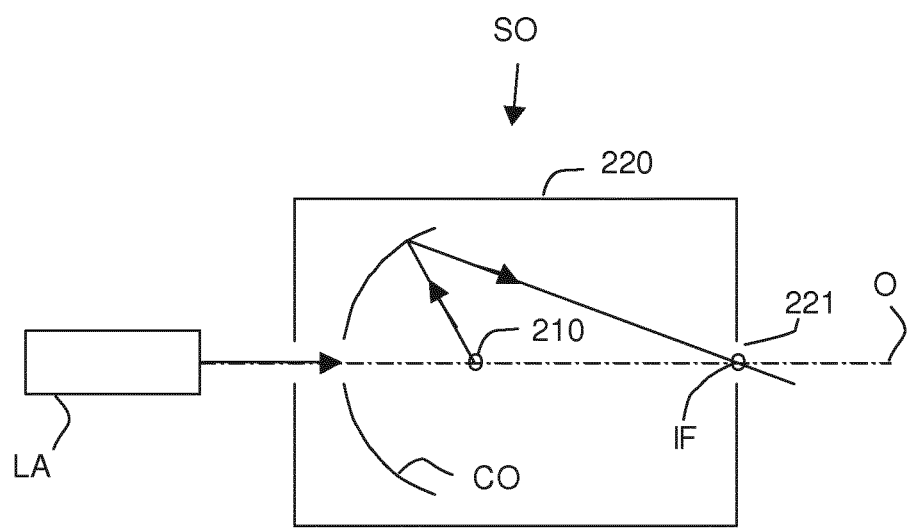
FIG. 3 is a schematic view of an alternative source of the apparatus of FIG. 1, the alternative being a LPP source.

Alternatively, the source SO may be part of an LPP radiation system as shown in FIG. 3. A laser LA is arranged to deposit laser energy into a fuel, such as xenon (Xe), tin (Sn) or lithium (Li), creating the highly ionized plasma 210 with electron temperatures of several 10's of eV. The energetic radiation generated during de-excitation and recombination of these ions is emitted from the plasma, collected by a near normal incidence collector optic CO and focused onto the opening 221 in the enclosing structure 220.

It may be desirable to measure the dose of EUV radiation which is being provided by the lithographic apparatus onto a target portion of the substrate W. In an embodiment of the present invention this may be done by projecting the grating 100 schematically illustrated in FIG. 4 onto the substrate and then measuring properties of an image of the grating.

Figure 4:
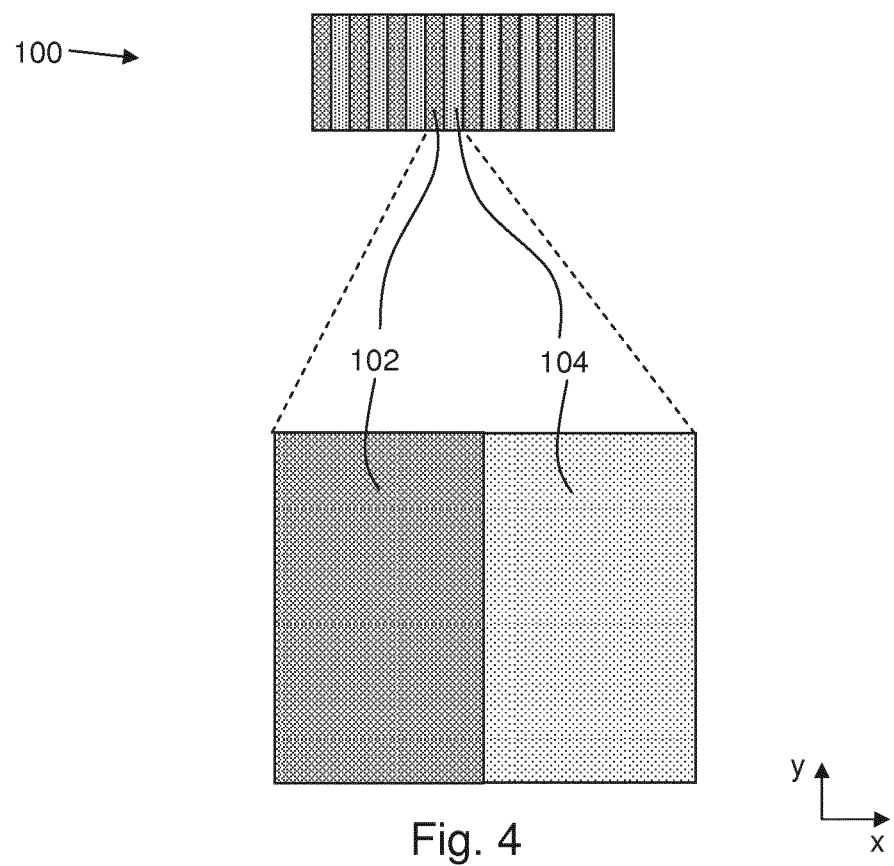
FIG. 4 is a schematic illustration of a grating according to an embodiment of the present invention.

The dose measurement grating 100 shown in FIG. 4 comprises a series of first reflective portions 102 and a series of second reflective portions 104, the reflective portions alternating with one another and thereby forming a grating. A pair of reflective portions 102, 104 are shown in an enlarged view at the bottom of FIG. 4. Each reflective portion is not patterned, and merely comprises a region having a predetermined shape and reflectivity. In an embodiment, the pair of reflective portions 102, 104 are around 16 microns long in the grating direction (i.e., the x-direction in FIG. 4). Alternatively, the pair of reflective portions may have any other suitable length. Although the first and second reflective portions both have the same length in the grating direction in FIG. 4, they may have different lengths. Although the dose measurement grating 100 shown in FIG. 4 comprises eight pairs of reflective portions 102, 104, the grating may comprise any suitable number of reflective portions. The dose measurement grating 100 may be surrounded by absorbing material.

The dimensions referred to above are the dimensions of an image which will be formed when the grating is projected onto a substrate by the lithographic apparatus. The lithographic apparatus may have a reduction factor of 4. Consequently, the dimensions of the dose measurement grating 100 on the support structure MT (or on a patterning device MA) will be 4 times greater than this.

The first reflective portion 102 has a reflectivity of around 60%, and the second reflective portion 104 has a reflectivity of around 30%. These reflectivities arise from properties of materials which are available to reflect EUV radiation. Specifically, a reflectivity of around 60% may be the maximum reflectivity which is possible using conventional material (e.g., a multilayer mirror) to reflect EUV radiation. The second reflective 104 portion has a reflectivity which is half that of the first reflective portion 102. If the first reflective portion 102 were to have a different reflectivity, then the reflectivity of the second reflective portion 104 could be selected according such that it is still half the reflectivity of the first reflective portion.

The second reflective portion 104 may have any suitable reflectivity which is less than the reflectivity of the first reflective portion 102 and which is greater than zero. The reflectivity of the second reflective portion 104 may be sufficiently high that a significant amount of EUV radiation is reflected from the second reflective portion (e.g., enough to cause a detectable change in resist on the substrate W). The reflectivity of the second reflective portion 104 may be sufficiently high that radiation reflected from the second reflective portion has a measurable effect on an image of the dose measurement grating 100 formed in resist.

The reflectivity of the second reflective portion 104 may be sufficiently different from the reflectivity of the first reflective portion 102 that a change caused in the resist on the substrate by EUV radiation reflected from the second reflective portion is measurably different from a change caused in the resist by EUV radiation reflected from the first reflective portion. The nonlinear response of the resist to the EUV radiation allows information to be obtained relating to the dose of EUV radiation delivered to the resist. The information about the EUV radiation dose may obtained using a method described further below which measures refractive index changes of the resist caused by the EUV radiation.

The dose measurement grating 100 is provided on the support structure MT (see FIGS. 1 and 2). In use, when it is desired to measure the dose of radiation which is being delivered by the lithographic apparatus to a substrate W, the support structure MT may be positioned such that the radiation beam B, 21 is incident upon the dose measurement grating 100, so that the radiation reflected from the grating is incident upon the substrate W. The dose measurement grating 100 may thereby be exposed into resist provided on the substrate. The grating may for example be exposed at a plurality of different locations on the substrate W.

Optionally, following exposure of the grating into the resist, the substrate W may be baked. This baking may be referred to as post exposure bake. Post exposure bake is a well known process, and may be used for example to catalytically perform and complete a photo-reaction that was initiated by the EUV radiation dose. Post exposure bake may also provide advantages such as improving the stability of the resist. The post exposure bake may for example comprise heating to the substrate W to around 110° C. for 1-2 minutes. The post exposure bake may for example be performed in a separate baking apparatus, which may be located in the same fabrication plant as the lithographic apparatus.

Following exposure of the substrate W (and following the post exposure bake if required), the position of the dose measurement grating 100 is measured by the alignment apparatus AS of the lithographic apparatus (see FIGS. 1 and 2). The alignment apparatus may be configured to measure the position of an alignment grating P1, P2 (see FIG. 1) by measuring the locations at which radiation is received on detectors following diffraction from the alignment grating. The alignment apparatus AS may be configured to indicate a position which is considered to be the centre of the alignment grating based upon the detected diffracted radiation. For ease of reference, this position may be referred to as the centre of gravity of the alignment grating. The alignment apparatus AS may measure the centre of gravity of the dose measurement grating 100 in the same manner.

The refractive index of the resist on the substrate W changes in a nonlinear manner with respect to exposure dose when it is exposed by EUV radiation. Due to this nonlinear refractive index change, the centre of gravity of an image (e.g., latent image) of the exposure dose grating 100 formed in resist on the substrate W, as measured by the alignment apparatus AS, will be moved to the left or right. The movement to the left or right of the image of the exposure dose grating 100 will depend upon the dose of EUV radiation projected onto the substrate. For example, the measured centre of gravity of the image of the exposure dose grating 100 may move to the right if the dose of EUV radiation is increased and may move to the left if the dose of EUV radiation is decreased (although the direction of movement may depend upon the EUV radiation dose and upon properties of the resist).

Figure 5:
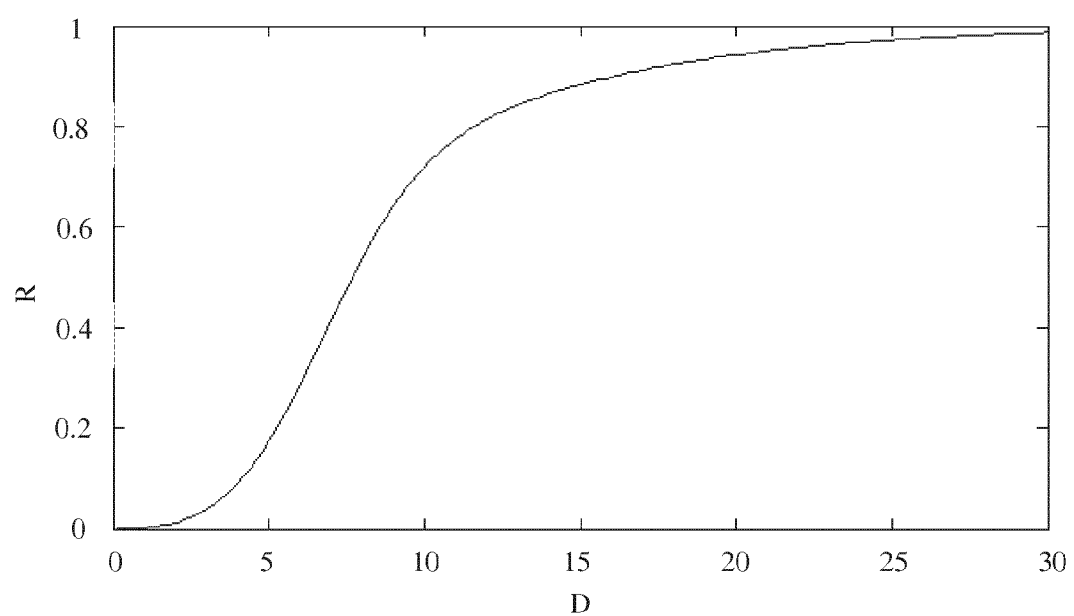
FIG. 5 is a graph which represents the refractive index change of resist as a function of the dose of radiation received by the resist.
Figure 6:
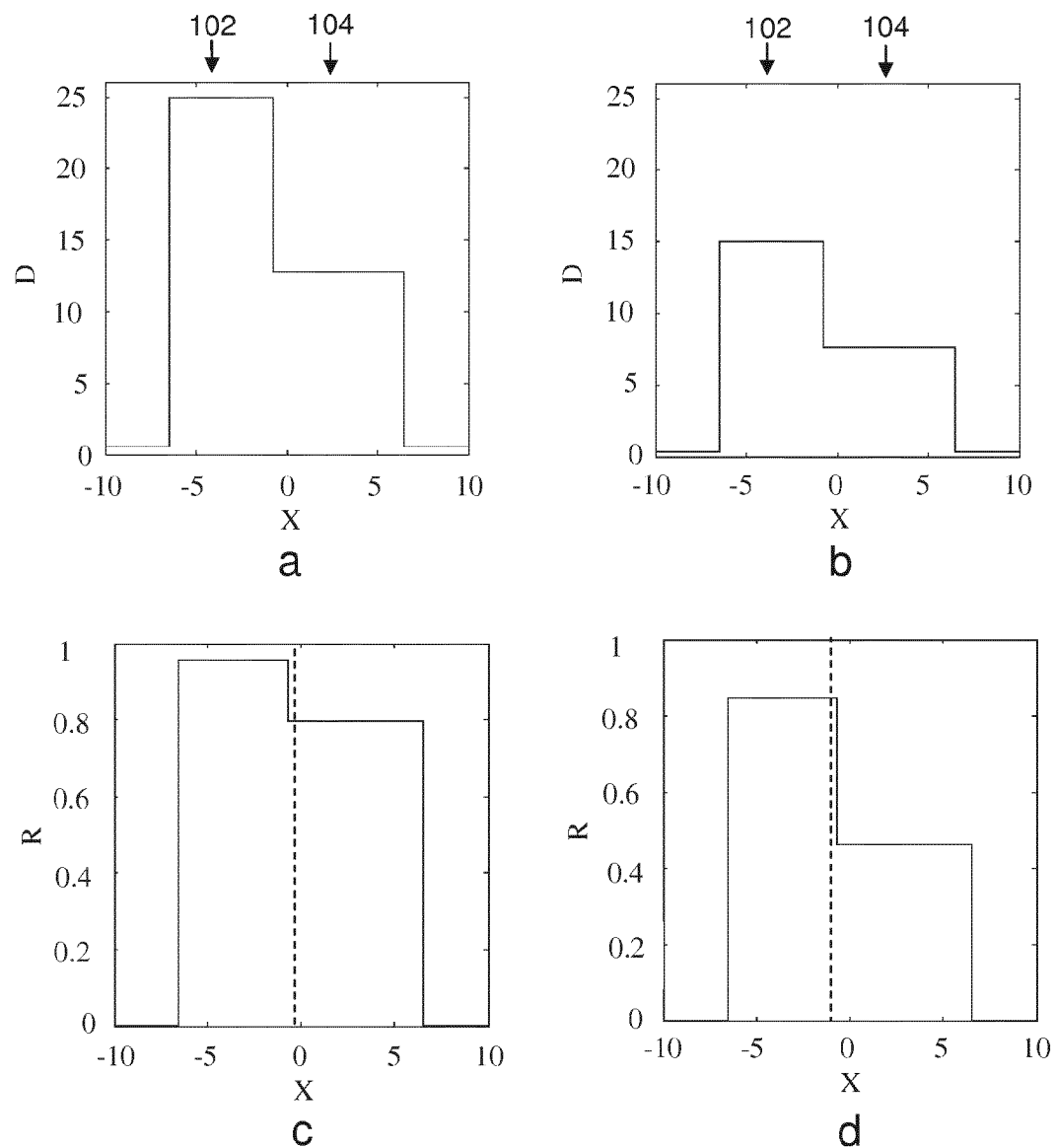
FIG. 6 is a set of graphs which illustrate the response of resist to radiation reflected by the grating shown in FIG. 4, FIGS. 6a and 6b showing first and second pairs of radiation doses received by resist, FIGS. 6c and 6d showing the refractive index change of the resist when the radiation doses are received.

The nonlinear response of the resist is represented by a graph in FIG. 5, and the effect of this nonlinear response on the image of the exposure dose grating 100 is shown in FIG. 6.

FIG. 5 shows the manner in which the refractive index of the resist changes as a function of the dose which is received by the resist. The graph is a schematic graph, and the units on the axes are arbitrary units. As may be seen, when a very low dose of EUV radiation is incident upon the resist the refractive index of the resist does not change. As the dose increases, the refractive index change increases at an increasing rate. The rate at which the refractive index changes increases until a refractive index change of around 0.5 is reached, after which the rate of change of the refractive index begins to reduce. The refractive index change tends towards 1 at high doses.

The effect of the nonlinear refractive index change of the resist is shown by the graphs in FIG. 6. FIGS. 6a and 6b show the dose of radiation delivered to resist as a function of position on the resist (labelled here as the x-direction) following reflection by the pair of reflective portions 102, 104 shown at the bottom of FIG. 4 (i.e., a pair of reflective portions of the exposure dose grating 100). FIGS. 6c and 6d show the refractive index change experienced by the resist upon receiving that dose, again represented as a function of position in the x-direction.

Referring first to FIG. 6a, a left hand region of the resist receives radiation which has been reflected by the first reflective portion 102 of the grating 100, and a right hand region receives radiation which has been reflected by the second reflective portion 104 of the grating. As mentioned further above, the reflectivity of the first reflective portion 102 is twice the reflectivity of the second reflective portion 104. Thus, the dose of EUV radiation received by the left hand region of the resist is twice the dose of EUV radiation received by the right hand region of the resist. The left hand region of the resist receives 25 units of radiation, whereas the right hand region receives 12.5 units of radiation.

The effect of the radiation shown in FIG. 6a upon the refractive index of the resist is shown in FIG. 6c. Referring again to FIG. 5, it may be seen that when the resist receives a dose of 25 units of radiation, a refractive index change of around 0.95 will occur. Similarly, when the resist receives a dose of 12.5 units of radiation, a refractive index change of around 0.8 will occur. The alignment apparatus AS will determine the centre of gravity of the grating exposed in the resist (referred to hereafter as the imaged grating). The imaged grating will comprise a grating having portions which have undergone a refractive index change of 0.95 alternating with portions which have undergone a refractive index change of 0.8. That is, although the second portion 104 of the imaged grating has received only half of the dose received by the first portion 102 of the imaged pattern, the refractive index change experienced by the second portion is roughly 80% of the refractive index change experienced by the first portion.

The manner in which the alignment apparatus AS measures the location of the imaged grating (i.e., using detected diffracted radiation) is such that a deviation of the measured centre of gravity of the imaged grating from a centre point of the grating (e.g., the midpoint between edges of the imaged pattern) will occur when different portions of the imaged grating have undergone different refractive index changes. The measured centre of gravity in this case is indicated schematically by a dotted line. If the first and second portions of the imaged grating had undergone the same refractive index change in the resist, then the alignment apparatus AS would measure the centre of gravity of the imaged grating as being at a centre point of the imaged pattern. However, when the refractive index change experienced by the second portion of the imaged grating is reduced, then this causes the measured centre of gravity of the imaged grating to move to the left. The movement to the left of the measured centre of gravity is relatively small in FIG. 6c due to the nonlinear response of the resist to the different doses.

FIGS. 6b and 6d illustrate a contrasting situation in which the difference in dose received by the resist gives rise to a much larger difference in the refractive index change, and consequently a much larger shift of the measured centre of gravity of the imaged pattern.

Referring first to FIG. 6b, a first portion 102 of the grating receives a dose of 15 units, and a second portion 104 of the grating receives a dose of 7.5 units. The effect of these doses may be determined using the graph shown in FIG. 5. Referring to FIG. 6d, the first portion of the imaged grating experiences a refractive index change of around 0.85, whereas the second portion of the imaged grating experiences a refractive index change of around 0.45. This larger difference between the refractive index changes (compared with that seen in FIG. 6c) is because the doses lie in a portion of the curve of FIG. 5 which has a high gradient (i.e., the rate of change of refractive index as a function of dose is greater). Because, due to the reduced dose, there is a larger difference between the refractive index change experienced by the first portion 102 of the imaged grating and that experienced by the second portion 104 of the imaged grating (the difference being approximately 50%), the measured centre of gravity of the imaged grating is shifted further to the left than was the case in FIG. 6c. The measured centre of gravity is indicated schematically by a dotted line.

In comparing FIGS. 6c and 6d it may be seen that measuring the position of the centre of gravity of the imaged grating will provide an indication of the dose delivered to the resist by the lithographic apparatus. Thus, projecting the grating of FIG. 4 onto a substrate, and then measuring the position of the imaged pattern, provides a measurement of the radiation dose which is delivered by the lithographic apparatus to the substrate.

The non-linear response of resist to EUV radiation is such that if the dose of EUV radiation is increased by a given factor, then the refractive index of the first and second portions 102, 104 of the imaged grating 100 will change with a different factor. This difference gives rise to a shift of the centre of gravity of the imaged grating 100, which is measured by the alignment apparatus AS. Since the change of refractive index is a non-linear function of the EUV radiation dose, measuring the shift of the centre of gravity allows the dose to be determined Since the dose measurement relies upon the response of the resist being non-linear, if there is a range of doses over which the response of the resist is linear then this range may be avoided when performing the dose measurement.

The dose measurement may be calibrated, for example by delivering different measured doses of EUV radiation to the resist and measuring the resulting refractive index change. This may for example be done using a dedicated calibration apparatus.

In an embodiment, during a measurement of the dose delivered by the lithographic apparatus, the grating 100 of FIG. 4 may be projected onto a substrate using different doses in order to image patterns in resist which correspond to different points on the curve of FIG. 5. For example, a series of images of the grating may be projected onto the substrate, each image being projected with a higher dose than the preceding image. Other ways of using the grating of FIG. 4 to obtain dose measurements may be used.

Measuring the dose of radiation delivered to a substrate allows the dose to be adjusted, for example in order to ensure that the lithographic apparatus remains within desired dose parameters. The dose delivered by the lithographic apparatus may be measured periodically in order to monitor for drift (i.e., variation over time) of the dose. If drift of the dose is detected, then adjustments may be made to parameters of the lithographic apparatus in order to correct the drift.

Radiation dose measurements performed using an embodiment of the present invention may be used to calibrate a photodiode or other sensor which is used to measure the energy of the EUV radiation beam.

Measurements of the dose may be performed in a variety of different ways in order to measure different dose-related parameters of the lithographic apparatus. For example, the variation of dose at different locations in the exposure slit of the lithographic apparatus may be performed (the exposure slit being a region which is illuminated during scanning exposures). The spatial stability and the temporal stability of the dose may be measured.

Although the grating 100 shown in FIG. 4 comprises pairs of rectangles located next to one another, the grating may have any suitable shape. A first portion of the grating 102 may comprise an unpatterned area having a first reflectivity, and a second portion 104 of the grating may comprise an unpatterned area having a second reflectivity. The second reflectivity is less than the first reflectivity.

Figure 7:
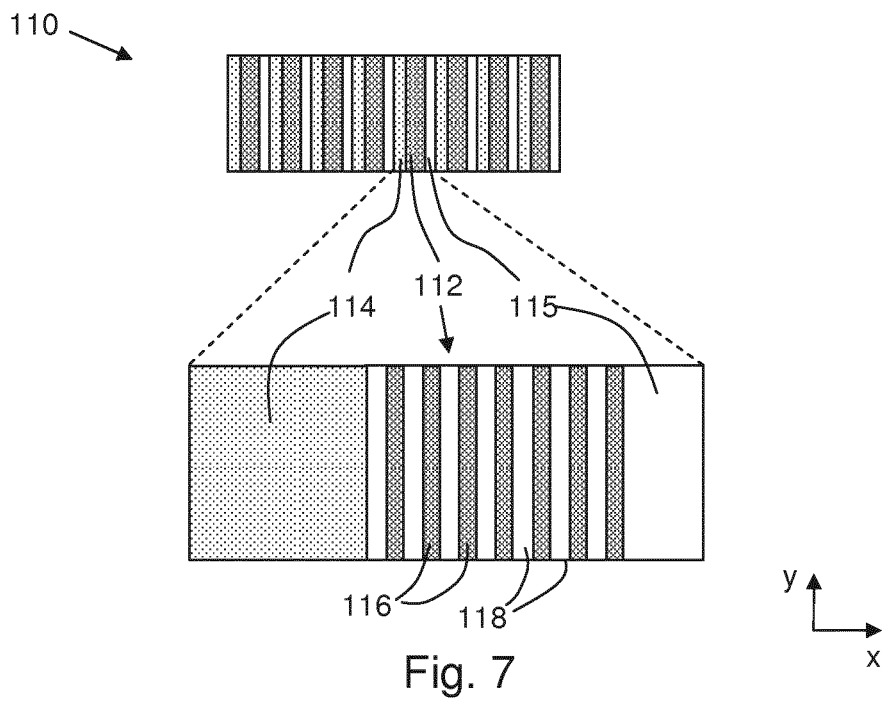
FIG. 7 is a schematic illustration of a grating according to an embodiment of the present invention.

A different of the embodiment of the present invention is shown schematically in FIG. 7. The different embodiment is a grating 110, each period of the grating comprising a first reflective portion 112, a second reflective portion 114, and an absorbing portion 115. Although eight periods of the grating are shown in FIG. 7 the grating may have any suitable number of periods. The grating 110 may be surrounded by absorbing material. The grating 110 may be used to measure the position of a focal plane of the projection system PS (see FIGS. 1 and 2) on an image side of the projection system (i.e., the side at which the substrate table WT is located). The grating may be referred to as a focus measurement grating 110.

A single period of the focus measurement grating 110 is shown in an expanded view in the lower portion of FIG. 7. The first reflective portion 112 is a sub-grating which comprises a series of reflective lines 116 which alternate with absorbing lines 118. The reflective lines 116 are sufficiently thick that they may be resolved in an image formed at the focal plane of the projection system. The reflective lines 116 have a reflectivity of around 60% and the absorbing lines have negligible reflectivity. The second reflective portion 114 comprises an unpatterned area which has a reflectivity of around 30%. The absorbing portion 115 has substantially zero reflectivity. The reflective lines 116 may have any suitable reflectivity. The second reflective portion 114 may have any suitable reflectivity which is less than the reflectivity of the reflective lines 116 and which is greater than zero. The reflectivity of the second reflective portion 114 may be sufficiently high that in use EUV radiation which is reflected from it has a measurable effect on resist (e.g., when EUV radiation is provided at an intensity that is used during patterning of subsrates). The reflectivity of the second reflective portion 114 may be sufficiently high that in use EUV radiation reflected from the second reflective portion has a measurable effect on an image of the focus measurement grating 110 formed in resist (e.g., when EUV radiation is provided at an intensity that is used during patterning of subsrates).

In an embodiment, each period of the focus measurement grating 110 may be 16 microns long in the grating direction (the x-direction in FIG. 7). The second reflective portion 114 may be around 6 microns long, the first reflective portion 112 may be around 7 microns long, and the absorbing portion 115 may be around 3 microns long. The focus measurement grating 110 may comprise eight periods.

The gratings and grating components may have any suitable lengths. Any suitable number of grating periods may be provided.

The reflective lines 116 may for example be 50 nm wide, and may for example be separated by absorbing lines 118 which are 50 nm. Alternatively, the lines may have any other suitable widths. Although seven reflective lines 116 are shown in FIG. 7, more reflective lines may be provided. For example, around 70 reflective lines may be provided.

The dimensions referred to above are the dimensions of an image which will be formed when the grating is projected onto a substrate by the lithographic apparatus. The lithographic apparatus may have a reduction factor of 4. Consequently, the dimensions of the focus measurement grating 110 on the support structure MT (or on a patterning device MA) will be 4 times grater than this.

The reflectivity of the second portion 114 is selected to substantially match the mean reflectivity of the reflective lines 116 and the absorbing lines 118. That is, the total radiation per unit area reflected by the second portion 114 is substantially equal to the total radiation per unit area reflected by the first portion 112. Thus, for example, if the reflective lines 116 had a reflectivity of 80%, then the second reflective portion 114 would be given a reflectivity of 40%. This assumes that the reflective lines 116 occupy half of the surface area of the first reflective portion 112. If the reflective lines 116 were to occupy a different proportion of the first reflective portion 112, then the reflectivity of the second reflective portion 114 could be adjusted accordingly. For example, if the reflective lines had a reflectivity of 60% and occupied 25% of the first reflective portion 112, then the second reflective portion would be given a reflectivity of 15%. The reflectivity of the second reflective portion 114 may be selected such that the total radiation dose per unit area projected onto a substrate from the second reflective portion 114 is substantially equal to the total radiation dose per unit area projected onto the substrate from the first reflective portion 112.

In an embodiment, the reflectivities of the first and second reflective portions 112, 114 may be modified in order to compensate for effects which may occur when projecting the grating onto a substrate. For example, shadowing of some parts of the focus measurement grating 110 may be caused by structures on the patterning device MA.

The reflectivities of the first and second reflective portions 112, 114 may be selected such that the mean radiation intensity per unit area received by an image of the first reflective portion 112 is substantially equal to the mean radiation intensity per unit area received by an image of the second reflective portion 114. The focus measurement grating 110 may be configured such that the mean intensity of radiation reflected by the first reflective portion 112 and received by the substrate W is substantially equal to the mean intensity of radiation reflected by the second reflective portion 114 and received by the substrate.

The focus measurement grating 110 of FIG. 7 may be used to measure the position of the focal plane of the projection system of the lithographic apparatus. One way in which this may be done is by projecting the focus measurement grating 110 onto a substrate W using the lithographic apparatus, the substrate being located a different distance from the projection system on each occasion. This may be referred to as the substrate having a different z-direction position (see FIG. 1) on each occasion. The positions of images formed in resist on the substrate W may then be measured using the alignment apparatus AS of the lithographic apparatus. The measured positions of the images may be used to determine the location of the focal plane of the projection system of the lithographic apparatus. The substrate W may undergo a post exposure bake before the positions of the images are measured.

As mentioned further above, the alignment apparatus AS of the lithographic apparatus may be configured to measure the position of alignment gratings P1, P2 (see FIG. 1) by detecting radiation diffracted by the gratings. The alignment apparatus may be configured to determine the position of a centre of an alignment grating (referred to here as the centre of gravity).

The position of the centre of gravity of an image of the focus measurement grating 110, as measured by the alignment apparatus, will depend upon whether or not the substrate was in the focal plane of the lithographic apparatus when the grating was projected. If the substrate was indeed in the focal plane of the projection system, then the reflective lines 116 of the first reflective portion 112 would form sharply resolved lines in the image formed in the resist. If the substrate was slightly out of focus, then lines would be formed in the image but they would not have sharp edges. If the substrate was further out of focus the lines would be more blurred and would begin to merge into one another. If the substrate was far out of focus, then the lines would blur together and would become a single block. The dose of radiation received by this single block would be the same as the dose of radiation received from the second reflective portion 114. The image of the focus measurement grating 110 would thus include a continuous block having the same refractive index, the continuous block being formed from radiation reflected by the first and second reflective portions 112, 114. The position of the measured centre of gravity of the image of the grating 110 will be different in each of these cases.

Figure 8:
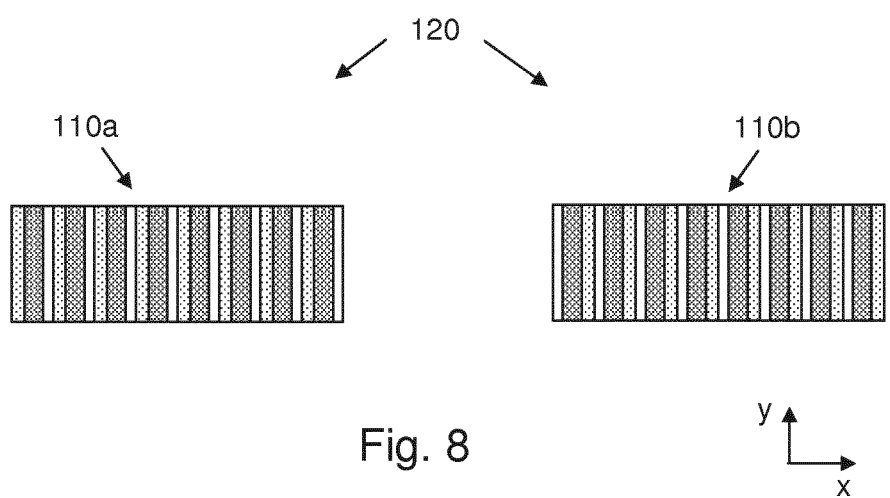
FIG. 8 is a schematic illustration of a pair of gratings according to the embodiment of the present invention shown in FIG. 7.

The grating 110 shown in FIG. 7 may be provided as one of a pair of gratings for example as shown in FIG. 8. Referring to FIG. 8, a focus measurement grating 120 comprises a left hand grating 110a which corresponds with the grating shown in FIG. 7, and a right hand grating 110b which is a mirror image of the grating shown in FIG. 7. The left hand grating 110a and the right hand grating 110b are separated from one another.

The gratings work in the same way as described above in relation to FIG. 7. However, since there are two gratings, the alignment apparatus AS of the lithographic apparatus measures two grating positions instead of measuring a single grating position. Because the gratings 110a, 110b are mirror images of each other, a displacement of the substrate from the focal plane will have an opposite effect on each imaged grating. Thus, as the substrate is moved away from the focal plane, the measured centre of gravity of the left hand imaged grating may move to the right and the measured centre of gravity of the right hand imaged grating may move to the left. The plane of best focus of the substrate may be determined by monitoring the separation between the measured positions of imaged gratings formed with the substrate at different distances from the projection system of the lithographic apparatus. The focal plane of the projection system of the lithographic apparatus may be identified as the plane at which the separation of imaged gratings passes through a maximum (or a minimum).

Providing two gratings in the manner shown in FIG. 8 is advantageous because it allows the separation between imaged gratings to be measured rather than the absolute position of an imaged grating, thereby eliminating errors arising from misalignments of the gratings.

In an alternative embodiment the gratings may have opposite orientations compared with those shown in FIG. 8. That is, the second reflective portions 124a, 124b may be located nearer to one another than the first reflective portions 122a, 122b. Where this is the case, the separation between the measured positions of the imaged gratings will vary in an opposite direction as a function of focus.

An advantage which arises from the gratings shown in FIGS. 7 and 8 is that the focus measurement provided by the grating may be substantially independent of the dose of radiation delivered to the substrate by the lithographic apparatus. This is not the case with some known focus measurement gratings, which may suffer from errors arising from dose variations. These errors may be particularly pronounced in an EUV lithographic apparatus because the intensity of radiation generated by the EUV radiation source may fluctuate significantly. Therefore, being able to measure the position of the focal plane of the lithographic apparatus in a manner which is substantially independent of dose variations is particularly advantageous in EUV lithographic apparatus.

Figure 9:
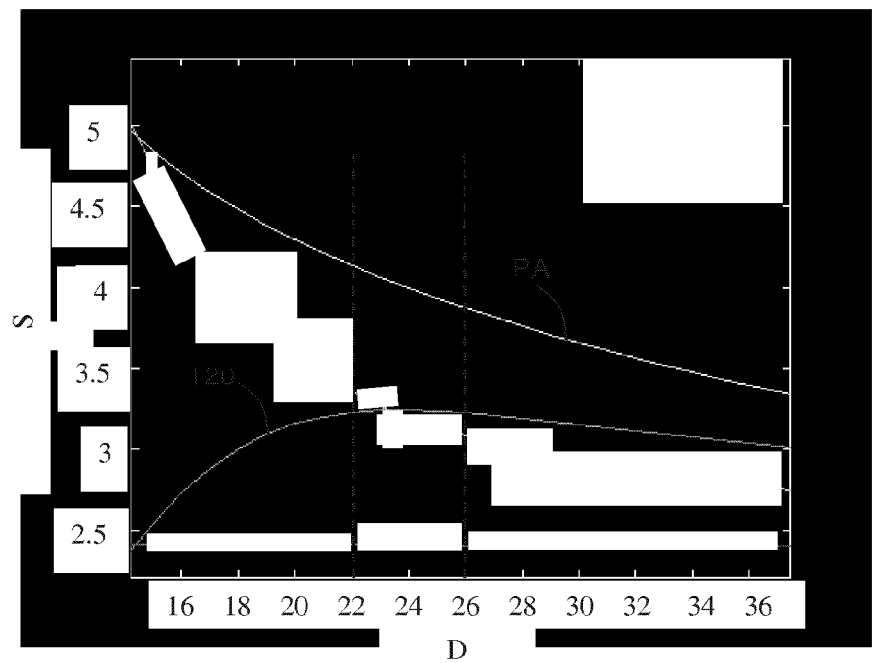
FIG. 9 is a graph which illustrates the response to dose variations of the gratings of the embodiment of the present invention shown in FIG. 8.

Due to the nonlinear response of resist to exposure, the gratings shown in FIGS. 7 and 8 may not provide measured positions which are independent of dose at all possible different doses. Therefore, a range of doses over which the measured positions of the gratings do not vary (or have a sufficiently small variation that this does not affect focus measurements) may be determined using a calibration method. FIG. 9 is a graph which illustrates one such range of doses.

Referring to FIG. 9, a line 120 indicates the measured separation S (in microns) between two gratings of the type shown in FIG. 8 as a function of radiation dose D (shown in mJ/cm$^2$). As may be seen, the measured separation varies considerably as the radiation dose changes. However, the variation as a function of dose is considerably less than the variation as a function of dose that would be seen if using a focus measurement grating (as indicated by the line). Furthermore, the variation as a function of dose passes through a maximum. In a region around the maximum, the separation variation as a function of dose is small. That is, the measured separation as a function of dose varies only slightly between a dose of around 22 mJ/cm$^2$ and a dose of around 26 mJ/cm$^2$. Focus measurements which are performed using doses within this range will suffer little or no measurement error due to dose variation. The dose range indicated in FIG. 9 is merely an example, and other dose ranges may be used. For example the dose range may be different for different resists.

The gratings shown in FIGS. 7 and 8 may be less susceptible than known focus measurement gratings to errors caused by resist thickness variation or by processing variations.

The exposure dose as provided by the lithographic apparatus may be measured using the grating shown in FIG. 4. Alternatively, a coarse dose measurement may be performed using a sensor such as a photodiode (the accuracy of the coarse measurement may be sufficient to ensure that the dose is within the predetermined range).

Although only a single grating 100 is shown in FIG. 4, a pair of gratings may be provided in an manner analogous to that shown in FIG. 8 (e.g., with the gratings being mirror images of each other). This may provide the advantage that dose measurements are not subject to errors arising from misalignment of the gratings.

Although the gratings shown in the Figures all extend in the x-direction, gratings may be provided which extend in a transverse direction (e.g., in the y-direction). Gratings which extend in two or more directions may be provided.

Gratings according to embodiments of the present invention may be provided on the support structure MT (see FIGS. 1 and 2). When the gratings are provided on the support structure MT in this manner, they are always available for use in the lithographic apparatus.

Additionally, or alternatively, gratings according to embodiments of the present invention may be provided on a patterning device MA. For example, the gratings may be provided in scribe lanes on the patterning device.

Figure 10:
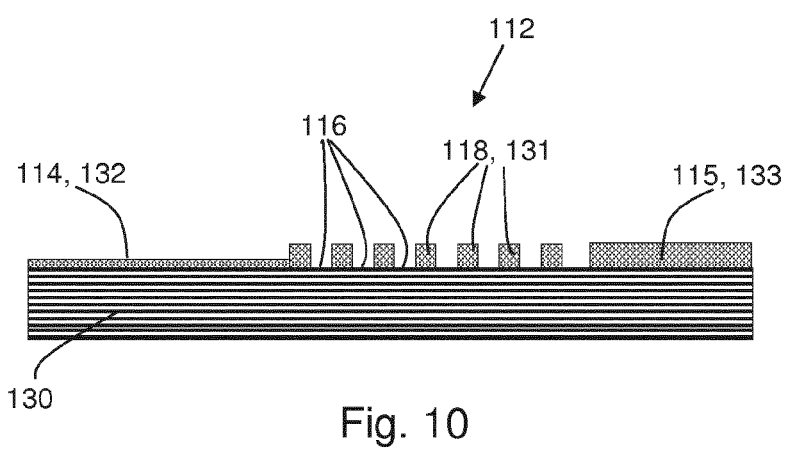
FIG. 10 is a cross-sectional view of part of the grating shown in FIG. 7.

One way in which gratings according to embodiments of the present invention may be formed is shown schematically in FIG. 10. FIG. 10 shows in cross-section a single period of the grating shown in FIG. 7. The grating period is formed by providing absorbing material on top of a multilayer mirror 130. The first reflective portion 112 comprises a series of reflective lines 116 separated by absorbing lines 118. The absorbing lines are formed by providing lines of absorbing material 131, the lines being arranged such that they form a grating. The lines of absorbing material 131 are sufficiently thick that EUV radiation which is incident upon them is substantially fully absorbed by them. EUV which passes between the lines of absorbing material 131 is reflected by the multilayer mirror 130 (e.g., with a reflectivity of 60%). Spaces between the lines of absorbing material 131 therefore act as reflective lines 116.

The second reflective portion 114 is provided by a layer of absorbing material 132. The layer of absorbing material 132 is sufficiently thin that some EUV radiation passes through the absorbing material, is reflected from the multilayer mirror 130 and passes back through the layer of absorbing material. Some EUV radiation is absorbed by the layer of absorbing material 132. The thickness of the layer of absorbing material 132 may be selected such that 30% of the incident EUV radiation is reflected from the second reflective portion 114.

The absorbing portion 115 of the grating period is formed from a layer of absorbing material 133 which is sufficiently thick that substantially all EUV radiation which is incident upon it is absorbed by the absorbing material.

The combined effect of the multilayer mirror 130 and the absorbing material 131-133 is to provide a grating period which has reflectivity as described further above in relation to FIG. 7.

The grating shown in FIG. 4 may be formed by providing no absorbing material instead of the lines of absorbing material 131, and by omitting the absorbing portion 115.

One way in which the absorbing material 131-133 may be provided with different thicknesses is by using an etch stop. Where this is done, a first layer of absorbing material may be provided onto the multilayer mirror. The etch stop is then provided on top of the first layer of absorbing material, following which additional absorbing material is provided on top of the etch stop. Lithographic patterning and etching may then be used to form the desired grating. A first etch which is stopped by the etch stop is used at locations where an intermediate thickness of absorbing layer is required, and a second etch which etches through the etch stop is used at locations where no absorbing material is required.

In an alternative approach, instead of using an etch stop, the time period during which a given portion of the absorbing material is in contact with an etching substance may be selected to obtain a desired thickness of absorbing material. For example, less etching time may be used at a location where an intermediate thickness of absorbing material is desired, and a longer etching time may be used at a location where no absorbing material is required.

A known method of measuring the position of the focal plane of a lithographic apparatus uses a grating which comprises a first reflective portion comprising a reflective grating and a second reflective portion comprising a reflective area. Focus measurements performed using this grating may suffer from errors due to dose variations. In an embodiment, the grating shown in FIG. 4 may be used to remove or reduce the effect of dose variation from the focus as measured using this known grating. One way in which this may be achieved is by providing the grating of FIG. 4 adjacent to the known focus measurement grating. The measured positions of the grating of FIG. 4 and the focus measurement grating will both have the same sensitivity to dose variations (provided that they have the same orientations). Therefore, the measured position of the grating of FIG. 4 may be subtracted from the measured position of the focus measurement grating in order to provide a focus measurement which is dose insensitive.

Embodiments of the present invention have referred to measuring the positions of gratings following baking of a substrate. In an embodiment, processes other than baking or in addition to baking may be applied to the substrate before the positions of the gratings are measured. In an embodiment the positions of the gratings may be measured without any processes having been applied to the substrate.

Measurements performed using gratings according to embodiments of the present invention may be performed in combination with dose measurements performed using one or more photodiodes.

Embodiments of the present invention have in common that the grating (100, 110) comprises a series of first reflective portions (102,112) which alternates with a series of second reflective portions (104, 114), the second reflective portions (104, 114) having a reflectivity which is less than the reflectivity of at least part of the first reflective portions (104, 114) and which is greater than zero. In the context of the exposure dose grating 100 the at least part of the first reflective portion 104 may be the first reflective portion 104. In the context of the focus measurement grating 110 the at least part of the first reflective portion may be the reflective lines 116.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the present invention in the context of optical lithography, it will be appreciated that the present invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The term "lens", where the context allows, may refer to any one or combination of various types of optical components, including refractive, reflective, magnetic, electromagnetic and electrostatic optical components.

The term "EUV radiation" may be considered to encompass electromagnetic radiation having a wavelength within the range of 5-20 nm, for example within the range of 13-14 nm, or example within the range of 5-10 nm such as 6.7 nm or 6.8 nm While specific embodiments of the present invention have been described above, it will be appreciated that the present invention may be practised otherwise than as described. For example, the present invention may take the form of a computer program containing one or more sequences of machine-readable instructions describing a method as disclosed above, or a data storage medium (e.g., semiconductor memory, magnetic or optical disk) having such a computer program stored therein. The descriptions above are intended to be illustrative, not limiting. Thus it will be apparent to one skilled in the art that modifications may be made to the present invention as described without departing from the scope of the claims set out below.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Further embodiments may be provided by the following numbered clauses:

1. A lithographic apparatus comprising: a support structure configured to support a patterning device, the patterning device being capable of imparting an EUV radiation beam with a pattern in its cross-section to form a patterned EUV radiation beam; and a projection system configured to project the patterned EUV radiation beam onto a target portion of the substrate,
   wherein the support structure is provided with a grating comprising a series of first reflective portions which alternates with a series of second reflective portions, the second reflective portions having a reflectivity which is less than a reflectivity of at least part of the first reflective portions and which is greater than zero.
2. The apparatus of clause 1, wherein the first reflective portions are unpatterned areas and the second reflective portions are unpatterned areas.
3. The apparatus of clause 2, wherein the first reflective portions are rectangular and the second reflective portions are rectangular.
4. The apparatus of clause 1, wherein the first reflective portions each comprise a sub-grating having reflective lines and absorbing lines, and the second reflective portions comprise unpatterned areas.
5. The apparatus of clause 4, wherein the grating further comprises a series of absorbing portions located between the first and second reflective portions.
6. The apparatus of clause 4, wherein the grating is configured such that the mean intensity of radiation reflected by the first reflective portion and received by the substrate is substantially equal to the mean intensity of radiation reflected by the second reflective portion and received by the substrate.
7. The apparatus of clause 1, wherein the second reflective portion comprises a layer of absorbing material located over a mirror, the layer of absorbing material allowing the transmission of some EUV radiation such that some radiation is reflected from the minor and passes back through the layer of absorbing material.
8. The apparatus of clause 1, wherein the reflectivity of the second reflective portion is around half of the reflectivity of the at least part of the first reflective portion.
9. The apparatus of clause 1, wherein the support structure is provided with a second grating which has an opposite orientation to the grating.
10. The apparatus of clause 1, wherein the support structure is provided with an additional grating which extends transverse to the grating.
11. The apparatus of clause 1, wherein the reflectivity of the second reflective portion is sufficiently high that in use a significant amount of EUV radiation will be reflected from the second reflective portion.
12. The apparatus of clause 1, wherein the reflectivity of the second reflective portion is sufficiently high that in use EUV radiation reflected from the second reflective portion will have a measurable effect on an image of the grating formed in resist on the substrate.
13. A patterning device provided with a grating comprising:
    a series of first reflective portions; and
    a series of second reflective portions,
    wherein the series of first reflective portions alternates with the series of second reflective portions,
    wherein the second reflective portions have a reflectivity which is less than the reflectivity of at least part of the first reflective portions and which is greater than zero.
14. A method of measuring a dose of radiation projected by a lithographic apparatus onto a substrate, comprising:
    illuminating a grating comprising a series of first reflective portions which alternates with a series of second reflective portions, the second reflective portions having a reflectivity which is less than a reflectivity of at least part of the first reflective portions and which is greater than zero;
    using the lithographic apparatus to image the grating into resist on a substrate; and measuring a center of gravity of the imaged grating using an alignment apparatus of the lithographic apparatus.
15. The method of clause 14, wherein the first reflective portions are unpatterned areas or rectangular and the second reflective portions are unpatterned areas or rectangular using EUV radiation.
16. A method of measuring the position of a focal plane of a lithographic apparatus, the method comprising:
    illuminating a grating according comprising a series of first reflective portions which alternates with a series of second reflective portions, the second reflective portions having a reflectivity which is less than a reflectivity of at least part of the first reflective portions and which is greater than zero using EUV radiation;
    using the lithographic apparatus to image that grating into resist on a substrate; and measuring a center of gravity of the imaged grating using an alignment apparatus of the lithographic apparatus.

The breadth and scope of the present invention should not be limited by any of the above-described exemplary embodiments, but should be defined only in accordance with the following claims and their equivalents.

What is claimed is:

1. A lithographic apparatus comprising:
a support structure comprising first and second portions, wherein:
the first portion is different from the second portion;
the first portion is configured to support a patterning device,
the second portion comprises a grating,
the grating comprises first and second reflective portions,
the first and second reflective portions are positioned in an alternating pattern,
the second reflective portions have a first reflectivity smaller than a second reflectivity of at least sub-portions of the first reflective portions, the first reflectivity being greater than zero, and
the patterning device is configured to impart an EUV radiation beam with a pattern in its cross-section to form a patterned EUV radiation beam; and
a projection system configured to project the patterned EUV radiation beam onto a target portion of a substrate.

2. The lithographic apparatus of claim 1, wherein the first and second reflective portions comprise unpatterned areas.

3. The lithographic apparatus of claim 2, wherein the first and second reflective portions comprise rectangular shapes.

4. The lithographic apparatus of claim 1, wherein:
each of the first reflective portions comprises a sub-grating having reflective lines and absorbing lines; and
each of the second reflective portions comprises an unpatterned area.

5. The lithographic apparatus of claim 4, wherein the grating is configured such that the first reflectivity substantially matches a mean reflectivity of the reflective lines and the absorbing lines.

6. The lithographic apparatus of claim 1, wherein the grating further comprises an absorbing portion located between a pair of first and second reflective portions from among the first and second reflective portions.

7. The lithographic apparatus of claim 1, wherein the grating is configured such that a mean intensity of radiation reflected by the first reflective portions and received by the substrate is substantially equal to a mean intensity of radiation reflected by the second reflective portions and received by the substrate.

8. The lithographic apparatus of claim 1, wherein:
each of the second reflective portions comprises a layer of absorbing material located over a mirror;
the layer of absorbing material is configured to allow transmission of at least a portion of the EUV radiation beam towards the mirror; and
the mirror is configured to reflect at least a sub-portion of the at least a portion of the EUV radiation beam towards the layer of absorbing material.

9. The lithographic apparatus of claim 1, wherein the first reflectivity is half of the second reflectivity.

10. The lithographic apparatus of claim 1, wherein the support structure further comprises a second grating having an opposite orientation to the grating.

11. The lithographic apparatus of claim 1, wherein the support structure further comprises another grating extending in a transverse direction to the grating.

12. The lithographic apparatus of claim 1, wherein the grating is configured such that a first radiation dose per unit area projected onto the substrate from the second reflective portions is substantially equal to a second radiation dose per unit area projected onto the substrate from the first reflective portions.

13. The lithographic apparatus of claim 1, further comprising an alignment apparatus configured to:
measure a center of gravity of an image of the grating projected onto the substrate; and
measure a dose of the EUV radiation beam received by the substrate based on the center of gravity.

14. The lithographic apparatus of claim 1, further comprising an alignment apparatus configured to:
measure a position of an image of the grating projected onto the substrate; and
determine a location of a focal plane of the projection system based on the position of the image of the grating.

15. The lithographic apparatus of claim 1, wherein the support structure further comprises another grating having a pattern that is a mirror image of a pattern of the grating.

16. A patterning device comprising:
first and second reflective portions, wherein:
the second reflective portions have a first reflectivity smaller than a second reflectivity of at least sub-portions of the first reflective portions;
each of the first reflective portions comprises a sub-grating having reflective lines and absorbing lines;
the first reflectivity is greater than zero and substantially matches a mean reflectivity of the reflective lines and the absorbing lines; and
each of the second reflective portions comprises an unpatterned area.

17. The patterning device of claim 16, wherein the patterning device further comprises an absorbing portion located between a pair of first and second reflective portions from among the first and second reflective portions.

18. A support structure of a lithography apparatus comprising:
first and second portions, wherein:
the first portion is different from the second portion;
the first portion is configured to support a patterning device;
the second portion comprises a grating;
the grating comprising first and second reflective portions;
the first and second reflective portions are positioned in an alternating pattern;
the second reflective portions have a first reflectivity smaller than a second reflectivity of at least sub-portions of the first reflective portions; and
the first reflectivity is greater than zero.

19. The support structure of claim 18, wherein the grating further comprises an absorbing portion located between a pair of first and second reflective portions from among the first and second reflective portions.

* * * * *